United States Patent
Choi et al.

(10) Patent No.: US 7,965,710 B1
(45) Date of Patent: Jun. 21, 2011

(54) DECODING OPERATIONS IN NORMAL TRANSMISSION MODE

(75) Inventors: Joonsang Choi, Sunnyvale, CA (US); Rajesh Juluri, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 599 days.

(21) Appl. No.: 11/945,183

(22) Filed: Nov. 26, 2007

Related U.S. Application Data

(60) Provisional application No. 60/867,319, filed on Nov. 27, 2006.

(51) Int. Cl.
*H04L 12/28* (2006.01)
(52) U.S. Cl. ..................... 370/389; 375/240.1
(58) Field of Classification Search .................. 370/389; 375/240.1, 240.12, 240.13, 240.14, 240.15, 375/240.16, 240.26
See application file for complete search history.

(56) References Cited

U.S. PATENT DOCUMENTS

| | | | | |
|---|---|---|---|---|
| 6,829,313 | B1 * | 12/2004 | Xu ................................ | 375/341 |
| 7,180,901 | B2 * | 2/2007 | Chang et al. ............. | 370/395.64 |
| 7,200,799 | B2 * | 4/2007 | Wang et al. .................... | 714/795 |
| 7,213,194 | B2 * | 5/2007 | Nieminen ...................... | 714/794 |
| 2010/0077275 | A1 * | 3/2010 | Yu et al. ......................... | 714/752 |

OTHER PUBLICATIONS

"802.16-2004 IEEE Standards", (Oct. 1, 2004), 857 pages.
"802.16e IEEE Standard", (Feb. 28, 2006), 822 pages.

* cited by examiner

*Primary Examiner* — Brenda Pham

(57) ABSTRACT

Various decoders, methods, systems, and devices are provided that selectively employ a decoding operation as a function of the size of a received data packet. In at least some embodiments, a first decoding operation is performed on data packets within a first size range. A second decoding operation(s), different from the first, is (are) performed on data packets within a second size range. In at least some embodiments, the first decoding operation is a sliding-window decoding operation and the second decoding operation is one other than a sliding-window decoding operation.

24 Claims, 9 Drawing Sheets

DECODING OPERATIONS IN NORMAL TRANSMISSION MODE

RELATED APPLICATION

This application claims priority to U.S. Provisional Application No. 60/867,319, filed on Nov. 27, 2006, the disclosure of which is incorporated by reference herein.

BACKGROUND

In wireless data transmission/reception scenarios, such as those that are compliant with the Institute of Electrical and Electronics Engineers (IEEE) Standard 802.16-2004, IEEE Standard 802.16e-2005, and IEEE 802.16 Cor2/D4-2007 specifications, a so-called sliding-window decoding architecture is commonly used as a hardware implementation option. The sliding-window architecture provides for efficient calculation complexities and reduces hardware requirements with minor performance degradation relative to that of other decoding architectures. However, such minor performance degradation is not guaranteed in situations where shorter or smaller-sized packets are received and decoded. For example, in the IEEE 802.16d/e specification, packets can be sized down to 6 bytes. Using the sliding-window decoding approach in the presence of shorter or smaller packets can lead to undesirable decoding performance and inefficiencies.

SUMMARY

This Summary is provided to introduce subject matter that is further described below in the Detailed Description and Drawings. Accordingly, the Summary should not be considered to describe essential features nor used to limit the scope of the claimed subject matter.

In accordance with one embodiment, a decoder comprises a plurality of decoding algorithms each implementing a decoding operation and decoding logic configured to implement a method comprising: receiving an encoded data packet; determining a size of the encoded data packet; using a first decoding operation for data packets within a first size range; and using a second decoding operation for data packets within a second size range, wherein the second decoding operation is different from the first decoding operation.

In other embodiments, a method comprises receiving an encoded data packet and determining a size of the encoded data packet. A first decoding operation is used for data packets within a first size range and a second decoding operation, different from the first, is used for data packets within a second size range.

BRIEF DESCRIPTION OF THE DRAWINGS

The same numbers are used throughout the drawings to reference like features.

DETAILED DESCRIPTION

Overview

Various decoders, methods, systems, and devices are provided that selectively employ a decoding operation as a function of the size of a received data packet. In at least some embodiments, a first decoding operation is performed on data packets within a first size range. A second decoding operation (s), different from the first, is (are) performed on data packets within a second, different size range. In at least some embodiments, the first decoding operation is a sliding-window decoding operation and the second decoding operation is one other than a sliding-window decoding operation. Various embodiments are employed in connection with systems that use the normal transmission mode in compliance with the Institute of Electrical and Electronics Engineers (IEEE) 802.16d/e standard.

By varying the decoding operation that is employed as a function of the data packet size, performance degradation issues can be mitigated. Such is particularly the case in short-packet decoding performance in the mobile multi-path fading channel.

In the discussion that follows, a section entitled "Operating Environment" is provided and describes one example operating environment in which one or more embodiments can be employed. It is to be appreciated and understood that this environment is provided for context and is not to be used to limit application of the claimed subject matter to one specific environment. Rather, the inventive principles can be employed in other environments in accord with the spirit and scope of the claimed subject matter. Following this, the discussion provides sections entitled "Example Transmitter" and "Example Receiver," each of which respectively describes a transmitter and a receiver that can be used in accordance with one or more embodiments. Following these sections, a section entitled "Implementation Example" describes but one implementation in accordance with one or more embodiments. A section entitled "Example Method" follows and describes an example method in accordance with one or more embodiments. Lastly, a section entitled "Example Receiver Environments" is provided and describes some examples of receiver environments that can utilize the principles described herein. Each of these sections may be used in accordance with one or more embodiments.

Operating Environment

Figure 1:
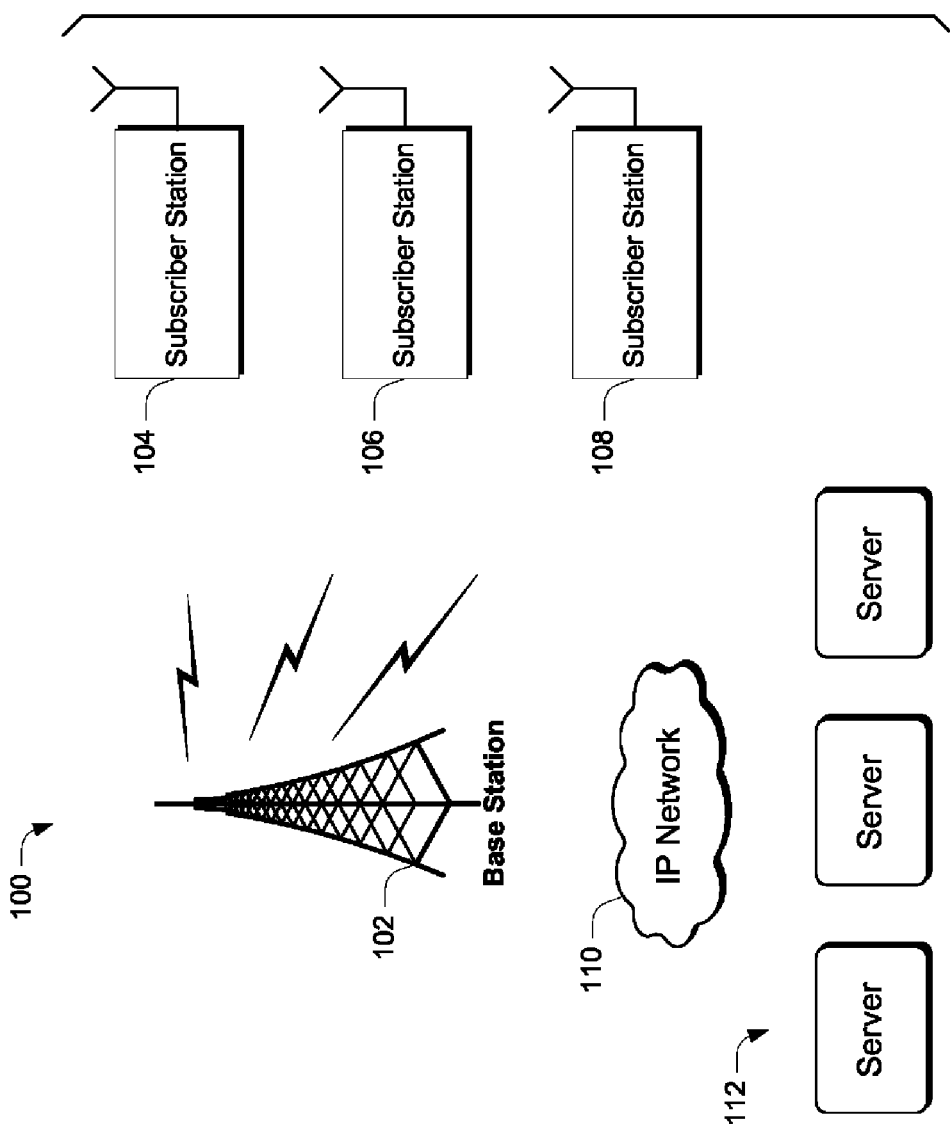
FIG. 1 illustrates a communication system in accordance with one or more embodiments.

FIG. 1 illustrates a communication system in accordance with one or more embodiments generally at 100. In the illustrated and described embodiments, communication system 100 utilizes an IEEE 802.16 communication system protocol and, more specifically, the IEEE 802.16d/e protocol. The IEEE 802.16 protocol can be used to provide Worldwide Interoperability for Microwave Access or WIMAX functionality operating in the frequency range from 10-66 GHz. WIMAX is typically used in a number of scenarios including, by way of example and not limitation, Voice over IP or "VoIP", TCP/IP, and with applications having different quality of service or QoS requirements. However, other embodiments can utilize communication system protocols other than the IEEE 802.16d/e protocol. Such other protocols can include, by way of example and not limitation, short packet length soft decision decoding operation including IEEE Standard 802.20 (Mobile Broadband Wireless Access (MBWA) Working Group).

Communication system 100 includes, in this example, one or more base stations 102 and multiple subscriber stations 104, 106, and 108. Base stations can be connected to an IP network 110 via a gateway (not shown). The IP network can include various special and general purpose servers shown generally at 112. Elements within both the base stations and subscriber stations are configured with processors, memories, instruction sets, and the like, that implement the functionality described in this document. Typically, communication that takes place within the system goes through base station 102. The base station is responsible for allocating bandwidth and can typically handle thousands of subscriber stations. In at least some embodiments, base station 102 is implemented as a WIMAX tower, which is similar in concept to a cell-phone tower. A WIMAX tower can provide coverage to a very large area, e.g., 8000 square kilometers.

Subscriber stations can include, by way of example and not limitation, subscriber stations such as those associated with residential and business customers. A subscriber station includes a receiver, such as a WIMAX receiver. The receiver and associated antenna(s) can be embodied in a small box or PCMCIA card, or can be embodied in some type of computing device such as a laptop computer, notebook computer, desktop computer, mobile device, and/or a handheld computing device to name just a few. Of course, the receiver can be embodied in other types of computing devices without departing from the spirit and scope of the claimed subject matter.

Communications system 100 includes two types of communication links. A downlink is used for communication from the base station 102 to the subscriber stations 104, 106, and 108. An uplink is used for communication from the subscriber stations to base station 102.

Communication system 100 utilizes the base station 102 to communicate packets to the various subscriber stations. In one or more embodiments, packets represent either headers or payloads with or without CRC or combinations of those. More specifically, when individual subscriber stations boot up, each can register with the base station. The base station can serve to exchange messages with the subscriber stations located in a corresponding service cell, authenticate and register subscriber stations via one or more servers in the IP network, transmit service request messages from the subscriber stations to the IP network, and transmit packets from the IP network to the subscriber stations, and so on.

Having described an example operating environment, consider now an example transmitter in accordance with one embodiment.

Example Transmitter

Figure 2:
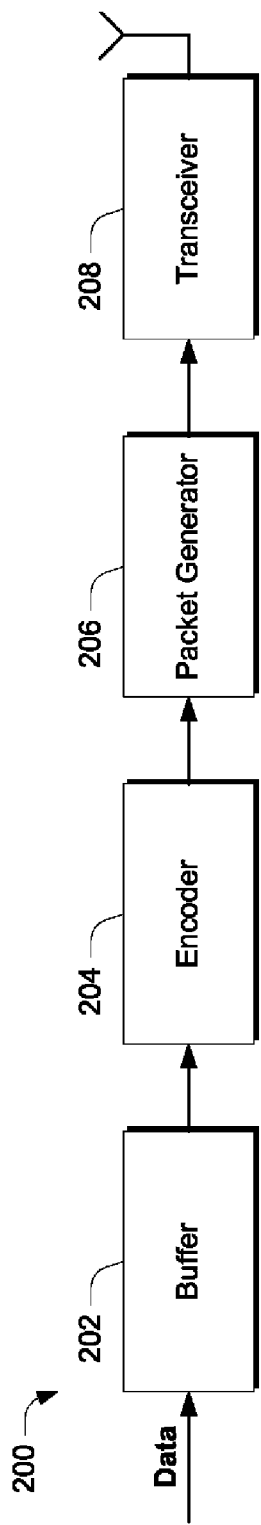
FIG. 2 illustrates a transmitter in accordance with one or more embodiments.

FIG. 2 illustrates a transmitter, such as that embodied at base station 102 (FIG. 1), generally at 200 in accordance with one or more embodiments. In this example, transmitter 200 includes a buffer 202, an encoder 204, a packet generator 206, and a transceiver 208 including one or more antennas.

Buffer 202 includes storage media such as random access memory for storing data that is to be transmitted to a receiver, such as one or more subscriber stations (not shown). Buffer 202 is coupled with encoder 204, which is configured to encode the buffer data in any suitable encoding scheme. In one or more embodiments, encoder 204 is implemented as a Convolutional Turbo Code (CTC) encoder. Other encoders can be used without departing from the spirit and scope of the claimed subject matter. Encoder 204 is responsible for generating both normal mode packets and, in at least some embodiment, H-ARQ modes packets that are compliant with the IEEE 802.16d/e protocol.

Encoder 204 is communicatively coupled with packet generator 206. The packet generator includes circuitry and logic that constructs data packets that are to be transmitted to various receivers. The packet generator is coupled with transceiver 208, which is configured to transmit the data packets to the various receivers. As noted above, transmitted packets can have different sizes that, in accordance with the embodiments described herein, are handled differently by receivers as described below.

Example Receiver

Figure 3:
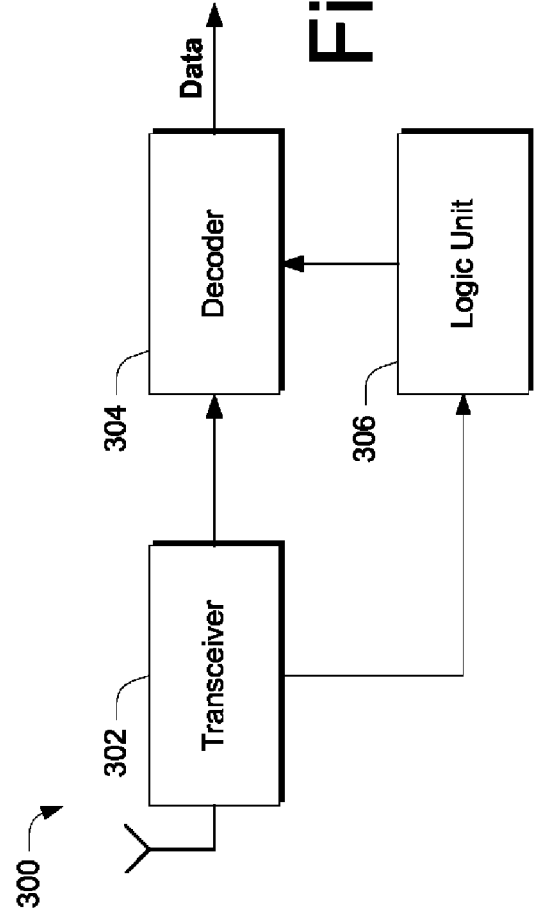
FIG. 3 illustrates a receiver in accordance with one or more embodiments.

FIG. 3 illustrates a receiver, generally at 300, in accordance with one or more embodiments. The illustrated receiver represents a subscriber station, such as subscriber stations 104, 106, and 108 in FIG. 1. In this example, receiver 300 includes a transceiver 302, a decoder 304, and a logic unit 306.

In the illustrated and described embodiment, transceiver 302 is one that operates in compliance with one or more of the IEEE 802.16 standards, such as the IEEE 802.16d/e standards.

Transceiver 302 is configured to receive transmitted packets from a transmitter, such as that shown in FIG. 2. Transceiver 302 is communicatively coupled to decoder 304 and provides received packets to the decoder for decoding in accordance with the principles described below. In the illustrated and described embodiment, decoder 304 is implemented as a Convolutional Turbo Code (CTC) decoder. Other decoders can be used without departing from the spirit and scope of the claimed subject matter.

Logic unit 306 is configured with a microprocessor controller and logic to facilitate decoding operations. Decoder 304 outputs data that has been decoded in accordance with the principles described below.

In operation, transceiver 302 receives transmissions, in at least some embodiments, in both normal and H-ARQ transmission modes, from a transmitter and provides transmitted data, such as data packets, to decoder 304 for decoding. Decoder 304 is configured to selectively employ decoding operations as a function of the size of a received packet. Accordingly, in at least some embodiments decoding operations are selected relative to size ranges into which received packets fall. That is, in at least some embodiments, a packet size threshold can be defined and then used as a measure to ascertain which particular decoding operation to perform relative to one or more packets. In at least some embodiments, a first decoding operation is performed on data packets within a first size range. A second decoding operation(s), different from the first, is (are) performed on data packets within a second size range. In at least some embodiments, the first decoding operation is a sliding-window decoding operation and the second decoding operation is one other than a sliding-window decoding operation. A sliding-window decoding operation can be used to split a received block into sub-blocks that may be decoded in parallel, as will be appreciated by the skilled artisan.

Decoding operations other than the sliding-window approach can include any suitable decoding operation. By way of example and not limitation, such decoding operations can include any soft decision-based, iterative decoder operation such as Log-MAP (maximum a-posteriori probability), max-log-MAP and the like, as well as others.

Implementation Example

Figure 4:
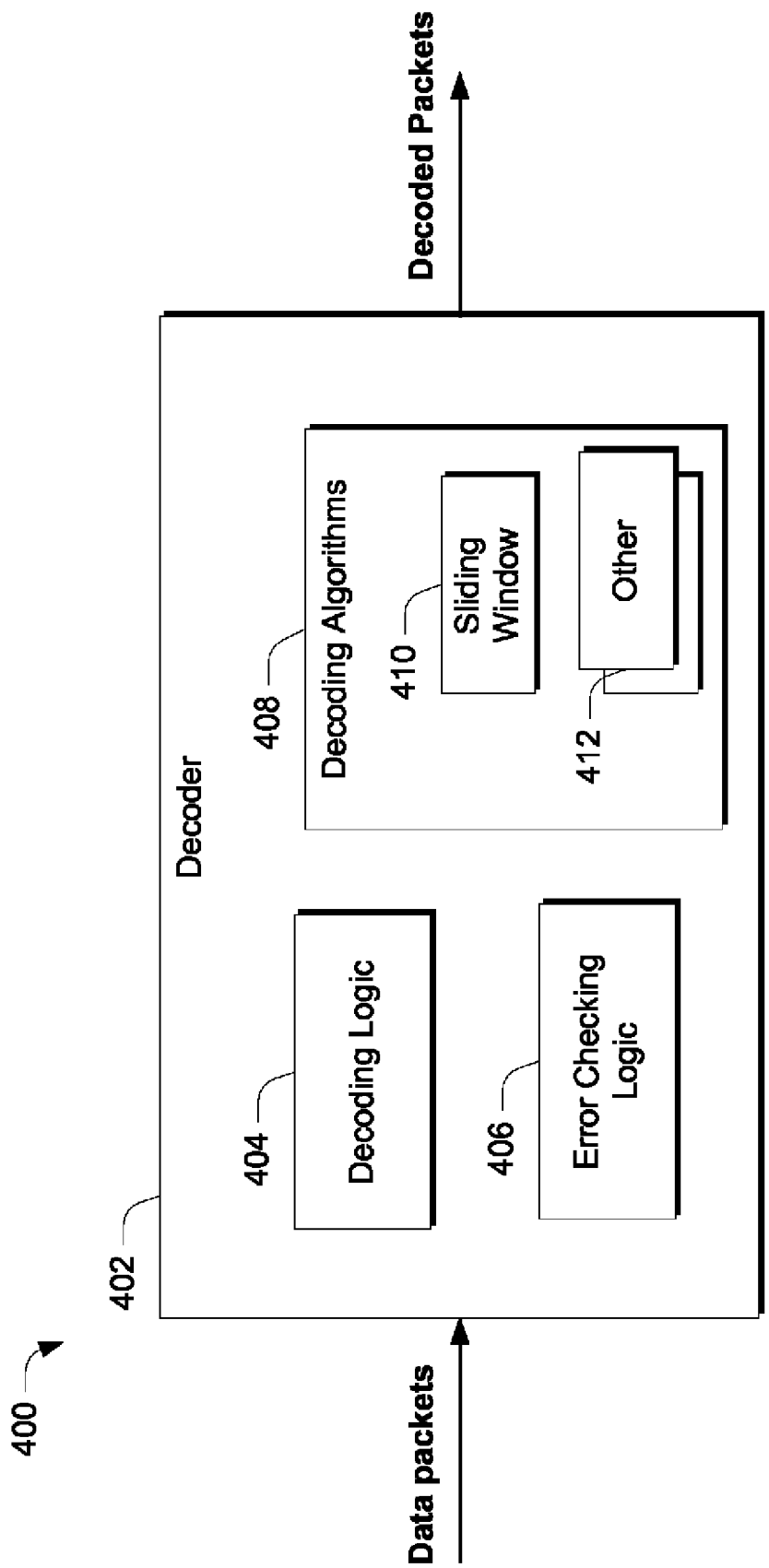
FIG. 4 illustrates an example system in accordance with one embodiment.

FIG. 4 illustrates an example system in accordance with one embodiment generally at 400. In this example, system 400 includes a decoder 402 embodied as a CTC decoder that operates using CTC principles. Decoder 402 includes, in this example, decoding logic 404, error checking logic 406, and one or more decoding algorithms 408 that can be utilized by decoding logic 404.

The decoder 402 can be implemented using any suitable hardware, software, firmware, or combination thereof. Decoding logic 404 is configured to receive data packets and attempt to decode the packets using decoding techniques described below. Decoding logic 404 utilizes error checking logic 406 to ascertain whether a particular packet or packets has or have been corrupted. Any suitable error checking techniques can be used. In at least some embodiments, error checking logic 406 includes cyclic redundancy check (CRC) logic that uses CRC data included with a packet to ascertain whether the packet is corrupted.

Decoding algorithms 408 include, in this example, multiple different decoding algorithms that can be used to decode packets received by decoder 402. In the illustrated and described embodiment, the decoding algorithms include, by way of example and not limitation, a sliding-window decoding algorithm 410 and at least one other decoding algorithm represented generally at 412. Such other decoding algorithm(s) can include any suitable decoding algorithm that can be used to decode encoded packets received by decoder 402. Some examples of such other algorithms are given above. It is to be appreciated and understood, however, that other decoding algorithms can be utilized without departing from the spirit and scope of the claimed subject matter.

In operation, decoding logic 404 is configured to utilize one or more of the decoding algorithms 408 to decode packets as a function of packet size. Accordingly, packets falling into a first size range can be decoded using a first decoding operation utilizing a first decoding algorithm. Packets falling into a second, different size range can be decoded using a second (or additional) decoding operation using a second (or additional), different decoding algorithm(s). In at least some embodiments, a packet size threshold is defined and utilized to measure received packets. If a particular packet at least meets the size threshold, a first decoding operation is performed. If, on the other hand, a particular packet does not meet the size threshold, a second different decoding operation is performed. In at least some embodiments, the first decoding operation is a sliding-window decoding operation and is performed on packets that are larger than the size threshold. Similarly, the second decoding operation, which is not a sliding-window decoding operation, is performed on packets that are smaller than the size threshold. Examples of such other decoding operations and algorithms are provided above.

In at least some embodiments, the threshold size utilized by decoding logic 404 is configurable and/or reconfigurable by a user. Thus, in at least some instances, thresholds can be adjusted (or ranges re-defined) and, in a sense, tuned to vary the size threshold or ranges at which decoding algorithms are selected. Such are useful in part by allowing the decoder to be programmed for different decoding scenarios. For example, computer-simulated decoding operations may suggest that a particular threshold or size range may result in improved decoding efficiencies. In this case, the decoding logic 404 can be reprogrammed to utilize a new threshold or range.

Example Method

Figure 5:
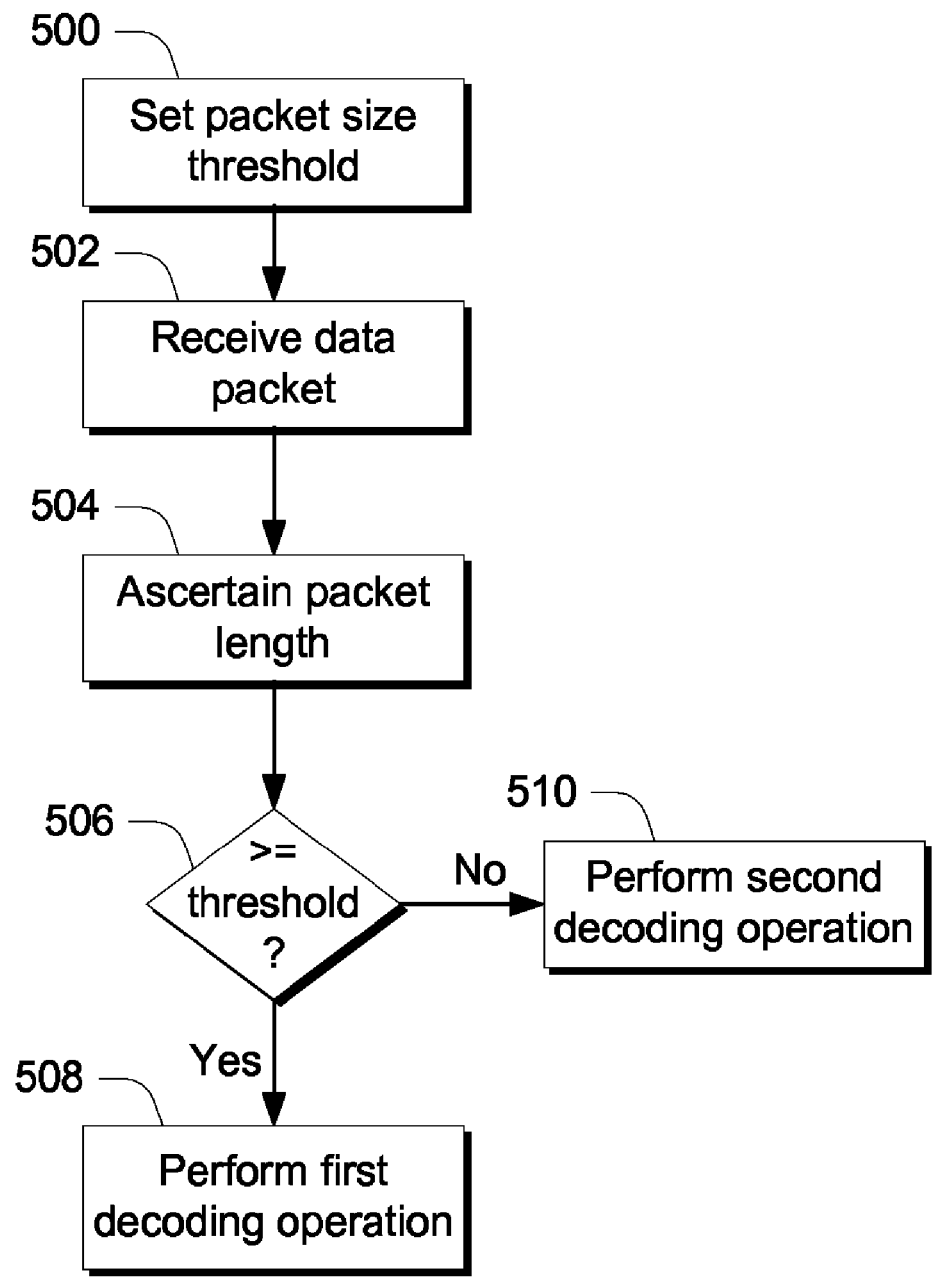
FIG. 5 is a flow diagram that describes steps in a method in accordance with one embodiment.

FIG. 5 is a flow diagram that describes steps in a method in accordance with one embodiment. The method can be implemented in connection with any suitable hardware, software, firmware, or combination thereof. In at least some embodiments, the method can be implemented, at least in part, by a decoder such as that shown and described in FIG. 4, which is part of a system such as that shown and described in FIG. 3. This method describes but one way in which packet size ranges can be defined and utilized to selectively decode received packets. As such, other methods of defining and utilizing size ranges can be utilized without departing from the spirit and scope of the claimed subject matter.

The method sets, at 500, a packet size threshold. Any suitable threshold can be used. In at least some embodiments, the threshold is set as a byte-length threshold. Further, in at least some embodiments, the threshold setting performed at 500 can be performed more than once. Specifically, in at least some embodiments, thresholds are reconfigurable or tunable to accommodate different decoding scenarios. A data packet is received at 502 and its length or size is determined at 504. In at least some embodiments, the length of a particular packet can be ascertained by counting the number of bytes that make up the packet. The byte length threshold is checked, at 506, and if met or exceeded, a first decoding operation is performed at 508. In at least some embodiments, the first decoding operation is one selected to efficiently decode packets of the size that meet or exceed the defined threshold. In the example given above, the first decoding operation is a sliding-window decoding operation and is selected for packets that are larger in size.

If, on the other hand, the byte-length threshold is not met or exceeded at 506, a second decoding operation is performed at 510. In at least some embodiments, the second decoding operation is one that is different from the first decoding operation. In embodiments where the first decoding operation is a sliding-window decoding operation, the second decoding operation is not a sliding-window decoding operation. Non-limiting examples of decoding operations that are not sliding-window decoding operations are provided above. Further, although only two different size-based decoding operations are described, more than two different size-based decoding operations can be conducted for size ranges that number more than two. For example, in some instances, three or more size ranges might be defined and three or more different decoding operations, individual ones of which are each associated with a particular different size range, might be used.

As noted above, the decoding methodology and related decoders can be utilized in implementations of architectures compliant with the IEEE 802.16d/e standard. It is to be appreciated and understood, however, that the methodologies and systems described in this document can be performed or used in connection with architectures that are compliant with standards other than the IEEE 802.16d/e standard.

Having described embodiments in which decoding operations can be selected as a function of packet size, consider now various receiver environments in which receivers, embodied with decoders such as those described above, can be used. Environments described just below are provided as examples only. Such are not intended to limit the scope or application of the claimed subject matter to the specific environments shown. Accordingly, other environments can be utilized without departing from the spirit and scope of the claimed subject matter.

Example Receiver Environments

Referring now to FIGS. 6-12, various exemplary implementations of receiver environments are shown. The various receiver environments can utilize the techniques described above.

Figure 6:
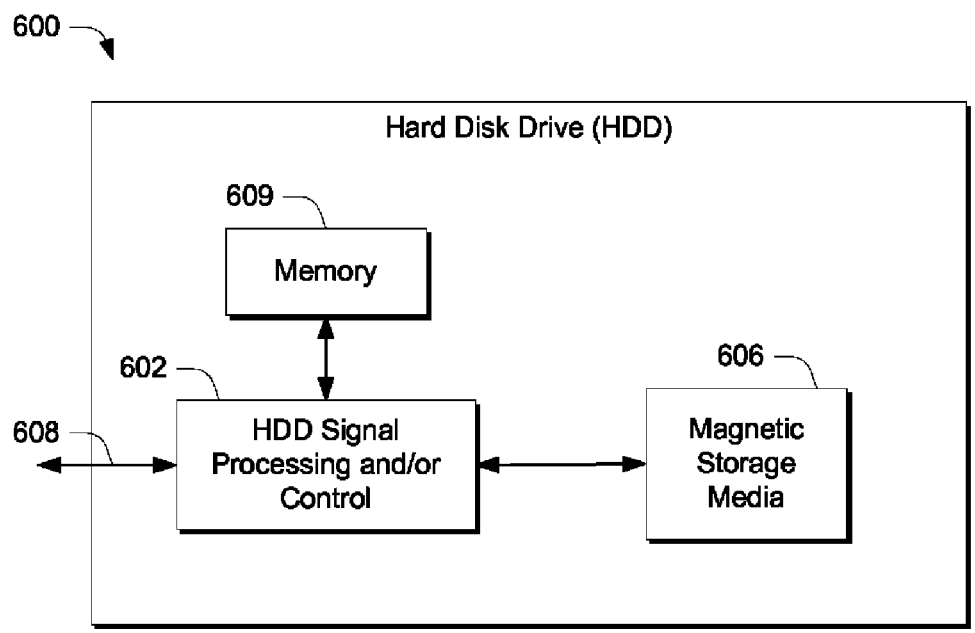
FIGS. 6-13 illustrate various implementations of example embodiments.

Referring to FIG. 6, a receiver may be embodied in a hard disk drive (HDD) 600 and may compromise part of its signal processing and/or control circuits, which are generally identified at 602. In some implementations, signal processing and/or control circuit 602 and/or other circuits (not shown) in HDD 600 may process data, perform coding, decoding and/or encryption, perform calculations, and/or format data that is output to and/or received from a magnetic storage medium 606.

HDD 600 may communicate with a host device (not shown) such as a computer, mobile computing devices such as personal digital assistants, cellular phones, media or MP3 players and the like, and/or other devices via one or more wired or wireless communication links 608. HDD 600 may be connected to memory 609, such as random access memory (RAM), a low latency nonvolatile memory such as flash memory, read only memory (ROM), and/or other suitable electronic data storage.

Figure 7:
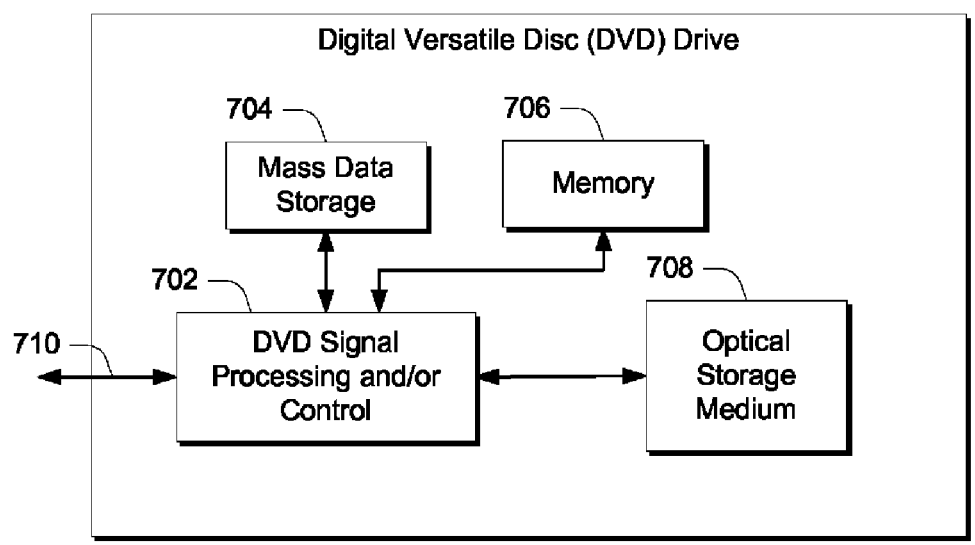

Referring now to FIG. 7, a receiver may be embodied in a digital versatile disc (DVD) drive 700 and may comprise part of its signal processing and/or control circuits, which are generally identified at 702. DVD drive 700 includes mass data storage 704, memory 706, and optical storage medium 708. Signal processing and/or control circuit 702 and/or other circuits (not shown) in DVD drive 700 may process data, perform coding, decoding and/or encryption, perform calculations, and/or format data that is read from and/or data written to an optical storage medium 708. In some implementations, signal processing and/or control circuit 702 and/or other circuits (not shown) in DVD drive 700 can also perform other functions such as encoding and/or decoding and/or any other signal processing functions associated with a DVD drive.

DVD drive 700 may communicate with an output device (not shown) such as a computer, television or other device via one or more wired or wireless communication links 710. DVD drive 700 may communicate with mass data storage 704 that stores data in a nonvolatile manner. Mass data storage 704 may include a hard disk drive (HDD) such as that shown in FIG. 6. The HDD may be a mini HDD that includes one or more platters having a diameter that is smaller than approximately 1.8". DVD 700 may be connected to memory 706, such as RAM, ROM, low latency nonvolatile memory such as flash memory, and/or other suitable electronic data storage.

Figure 8:
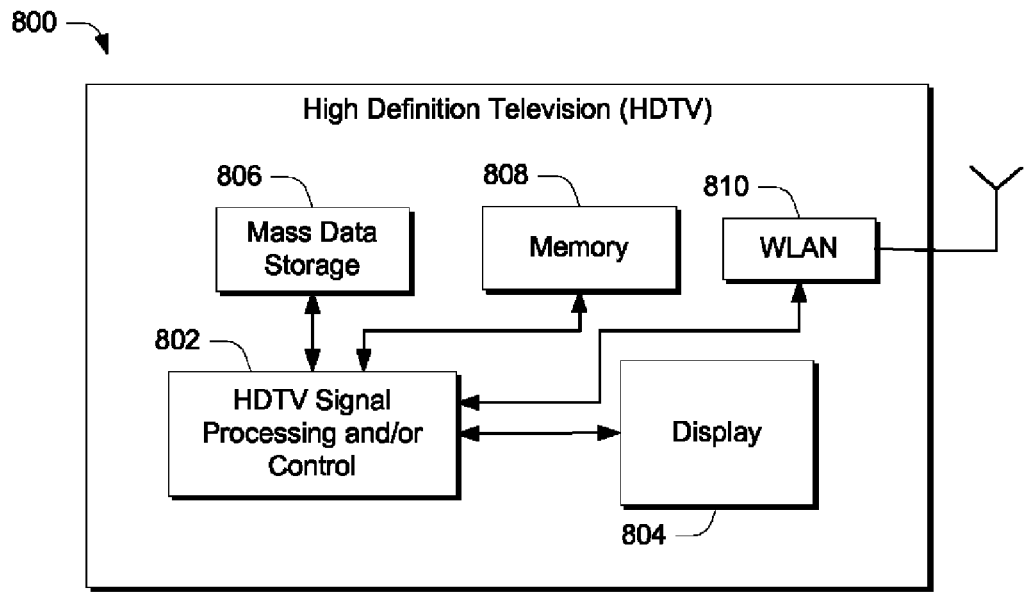

Referring now to FIG. 8, a receiver may be embodied in a high definition television (HDTV) 800 and may be implemented in either or both signal processing and/or control circuits, which are generally identified at 802, a WLAN interface and/or mass data storage of the HDTV 800. HDTV 800 receives HDTV input signals in either a wired or wireless format and generates HDTV output signals for a display 804. In some implementations, signal processing circuit and/or control circuit 802, and/or other circuits (not shown) of HDTV 800 may process data, perform coding, decoding and/or encryption, perform calculations, format data, and/or perform any other type of HDTV processing that may be required.

HDTV 800 may communicate with mass data storage 806 that stores data in a nonvolatile manner such as optical and/or magnetic storage devices. At least one HDD may have the configuration shown in FIG. 6 and/or at least one DVD may have the configuration shown in FIG. 7. The HDD may be a mini HDD that includes one or more platters having a diameter that is smaller than approximately 1.8". HDTV 800 may be connected to memory 808 such as RAM, ROM, low latency nonvolatile memory such as flash memory, and/or other suitable electronic data storage. HDTV 800 also may support connections with a WLAN via a WLAN network interface 810.

Figure 9:
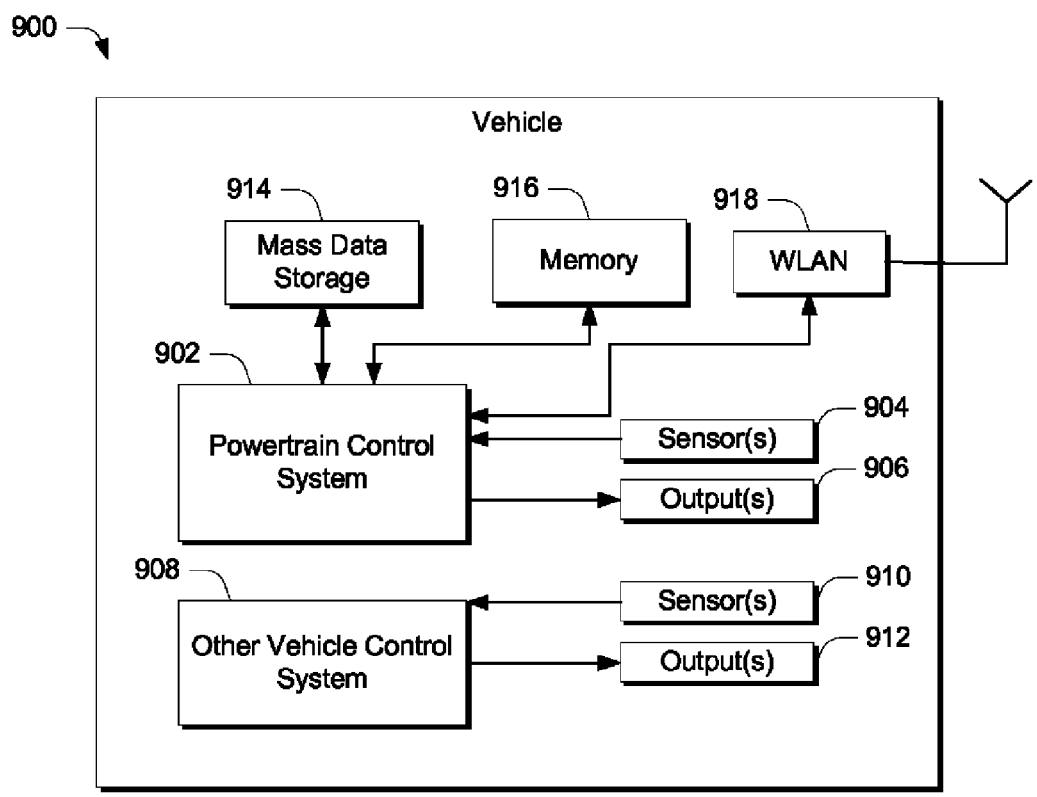

Referring now to FIG. 9, a receiver may be implemented as part of a communication system of a vehicle 900, a WLAN interface, and/or mass data storage of the vehicle control system. In some implementations, a powertrain control system 902 receives inputs from one or more sensors 904 such as temperature sensors, pressure sensors, rotational sensors, airflow sensors, and/or any other suitable sensors, and/or that generates one or more output control signals 906 such as engine operating parameters, transmission operating parameters, and/or other control signals.

A receiver can be embodied in other control systems 908 of vehicle 900. Control system 908 may likewise receive signals from input sensors 910 and/or output control signals 912 to one or more output devices. In some implementations, control system 908 may be part of an anti-lock braking system (ABS), a navigation system, a telematics system, a vehicle telematics system, a lane departure system, an adaptive cruise control system, a vehicle entertainment system such as a stereo, DVD, compact disc, and the like. Still other implementations are contemplated.

Powertrain control system 902 may communicate with mass data storage 914 that stores data in a nonvolatile manner. Mass data storage 914 may include optical and/or magnetic storage devices for example hard disk drives (HDD) and/or DVDs. At least one HDD may have the configuration shown in FIG. 6 and/or at least one DVD may have the configuration shown in FIG. 7. The HDD may be a mini HDD that includes one or more platters having a diameter that is smaller than approximately 1.8". Powertrain control system 902 may be connected to memory 916 such as RAM, ROM, low latency nonvolatile memory such as flash memory, and/or other suitable electronic data storage. Powertrain control system 902 also may support connections with a WLAN via a WLAN network interface 918. The control system 908 may also include mass data storage, memory, and/or a WLAN interface (all not shown).

Figure 10:
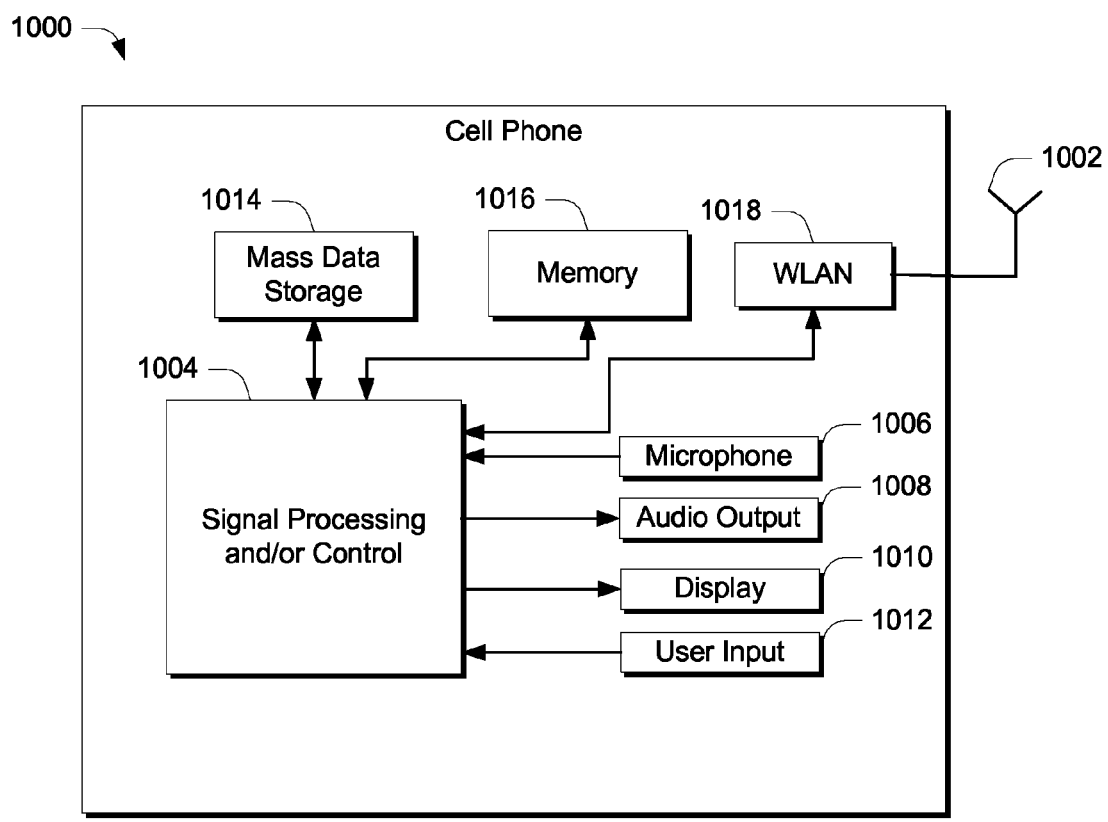

Referring now to FIG. 10, the receiver may be embodied in a cellular phone 1000 that may include a cellular antenna 1002. The receiver may be implemented in connection with either or both signal processing and/or control circuits, which are generally identified in at 1004, a WLAN interface and/or mass data storage of the cellular phone 1000. In some implementations, cellular phone 1000 includes a microphone 1006, an audio output 1008 such as a speaker and/or audio output jack, a display 1010, and/or an input device 1012 such as a keypad, pointer, voice actuation device, and/or other input device. Signal processing and/or control circuits 1004 and/or other circuits (not shown) in cellular phone 1000 may process data, perform coding, decoding and/or encryption, perform calculations, format data, and/or perform other cellular-phone functions.

Cellular phone 1000 may communicate with mass data storage 1014 that stores data in a nonvolatile manner such as optical and/or magnetic storage devices for example hard disk drives (HDD) and/or DVDs. At least one HDD may have the configuration shown in FIG. 6 and/or at least one DVD may have the configuration shown in FIG. 7. The HDD may be a mini HDD that includes one or more platters having a diameter that is smaller than approximately 1.8". Cellular phone 1000 may be connected to memory 1016 such as RAM, ROM, low latency nonvolatile memory such as flash memory and/or other suitable electronic data storage. Cellular phone 1000 also may support connections with a WLAN via a WLAN network interface 1018.

Figure 11:
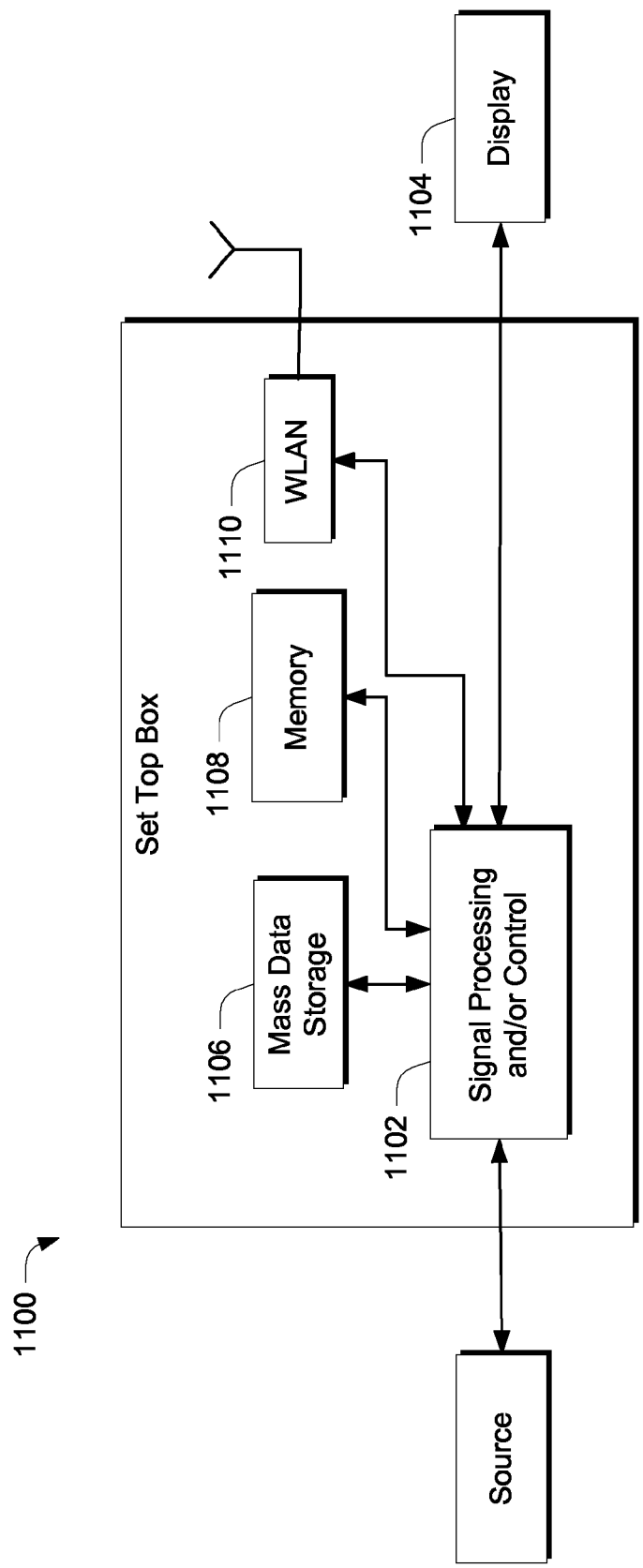

Referring now to FIG. 11, a receiver may be embodied in a set top box 1100, which may be implemented by either or both signal processing and control circuits, which are generally identified at 1102, a WLAN interface, and/or mass data storage of the set top box 1100. Set top box 1100 receives signals from a source such as a broadband source and outputs standard and/or high definition audio/video signals suitable for a display 1104, such as a television and/or monitor and/or other video and/or audio output devices. Signal processing and/or control circuits 1102 and/or other circuits (not shown) of the set top box 1100 may process data, perform coding, decoding and/or encryption, perform calculations, format data, and/or perform any other set-top-box function.

Set top box 1100 may communicate with mass data storage 1106 that stores data in a nonvolatile manner. Mass data storage 1106 may include optical and/or magnetic storage devices for example hard disk drives (HDD) and/or DVDs. At least one HDD may have the configuration shown in FIG. 6 and/or at least one DVD may have the configuration shown in FIG. 7. The HDD may be a mini HOD that includes one or more platters having a diameter that is smaller than approximately 1.8". Set top box 1100 may be connected to memory 1108 such as RAM, ROM, low latency nonvolatile memory such as flash memory, and/or other suitable electronic data storage. Set top box 1100 also may support connections with a WLAN via a WLAN network interface 1110.

Figure 12:
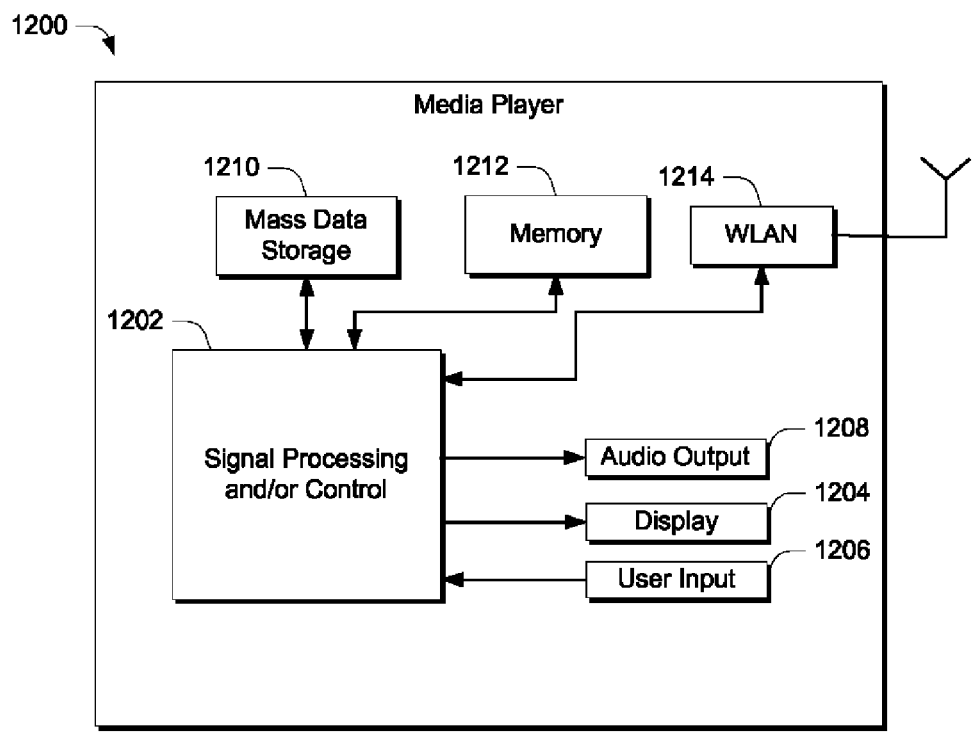

Referring now to FIG. 12, a receiver may be embodied in a media player 1200 and may be implemented in connection with either or both signal processing and/or control circuits, which are generally identified at 1202, a WLAN interface and/or mass data storage of the media player 1200. In some implementations, media player 1200 includes a display 1204 and/or a user input 1206 such as a keypad, touchpad, and the like. In some implementations, media player 1200 may employ a graphical user interface (GUI) that typically employs menus, drop down menus, icons, and/or a point-and-click interface via display 1204, and/or user input 1206. Media player 1200 further includes an audio output 1208 such as a speaker and/or audio output jack. Signal processing and/or control circuits 1202 and/or other circuits (not shown) of media player 1200 may process data, perform coding, decoding and/or encryption, perform calculations, format data, and/or perform any other media player function.

Media player 1200 may communicate with mass data storage 1210 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives (HDD) and/or DVDs. At least one HDD may have the configuration shown in FIG. 6 and/or at least one DVD may have the configuration shown in FIG. 7. The HDD may be a mini HDD that includes one or more platters having a diameter that is smaller than approximately 1.8". Media player 1200 may be connected to memory 1212 such as RAM, ROM, low latency nonvolatile memory such as flash memory, and/or other suitable electronic data storage. Media player 1200 also may support connections with a WLAN via a WLAN network interface 1214.

Figure 13:
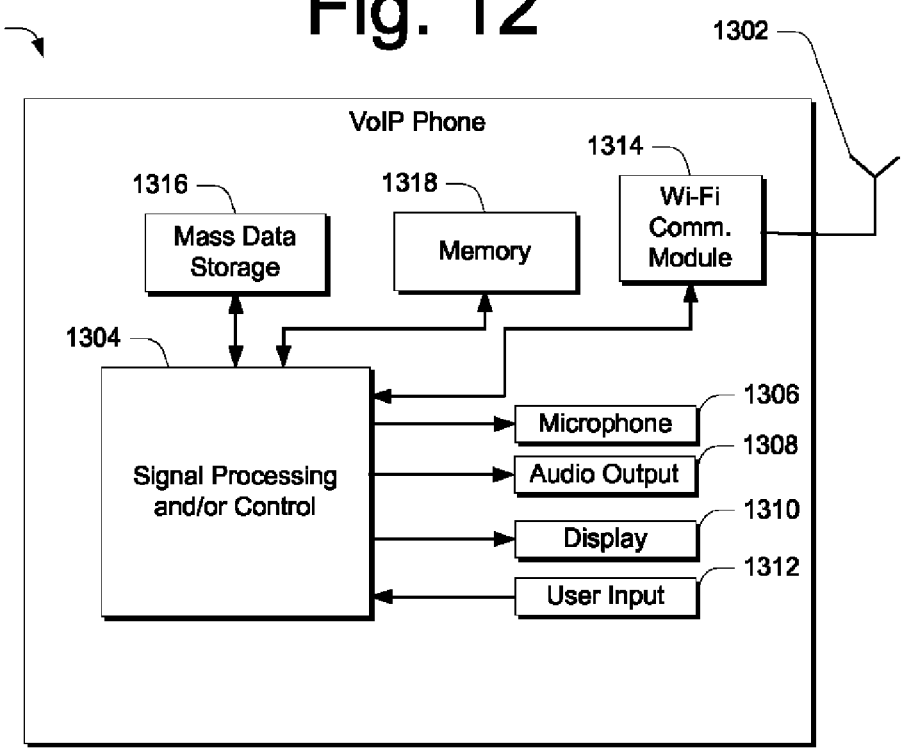

Referring to FIG. 13, a receiver may be embodied in connection with a Voice over Internet Protocol (VoIP) phone 1300 that may include an antenna 1302. The receiver may be implemented in connection with either or both signal processing and/or control circuits, which are generally identified at 1304, a wireless interface, and/or mass data storage of the VoIP phone 1300. In some implementations, VoIP phone 1300 includes, in part, a microphone 1306, an audio output 1308 such as a speaker and/or audio output jack, a display monitor 1310, an input device 1312 such as a keypad, pointing device, voice actuation, and/or other input devices, and a Wireless Fidelity (Wi-Fi) communication module 1314. Signal processing and/or control circuits 1304 and/or other circuits (not shown) in VoIP phone 1300 may process data, perform coding, decoding and/or encryption, perform calculations, format data, and/or perform other VoIP phone functions.

VoIP phone 1300 may communicate with mass data storage 1316 that stores data in a nonvolatile manner such as optical and/or magnetic storage devices, for example hard disk drives (HDD) and/or DVDs. At least one HDD may have the configuration shown in FIG. 6 and/or at least one DVD may have the configuration shown in FIG. 7. The HDD may be a mini HDD that includes one or more platters having a diameter that is smaller than approximately 1.8". VoIP phone 1300 may be connected to memory 1318, which may be a RAM, ROM, low latency nonvolatile memory such as flash memory, and/or other suitable electronic data storage. VoIP phone 1300 is configured to establish communications link with a VoIP network (not shown) via a Wi-Fi communication module 1314. Still other implementations in addition to those described above are contemplated.

CONCLUSION

Various decoders, methods, systems, and devices are provided that selectively employ a decoding operation as a function of the size of a received data packet. In at least some embodiments, a first decoding operation is performed on data packets within a first size range. A second decoding operation(s), different from the first, is (are) performed on data packets within a second size range. In at least some embodiments, the first decoding operation is a sliding-window decoding operation and the second decoding operation is one other than a sliding-window decoding operation. Various embodiments are employed in connection with systems that use the normal transmission mode in compliance with the IEEE 802.16d/e standard.

By varying the decoding operation that is employed as a function of the data packet size, performance degradation issues can be relieved. Such is particularly the case in short packet decoding performance in the mobile multi-path fading channel, as will be appreciated by the skilled artisan.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

We claim:

1. A decoder comprising:
   decoding logic configured to implement a method comprising:
   receiving encoded data packets;
   determining sizes of the encoded data packets; and
      using a first decoding operation responsive to determining that the size of one of the encoded data packets is within a first size range, the first decoding operation implementing a first decoding algorithm; and
      using a second decoding operation responsive to determining that the size of another of the encoded data packets is within a second size range, the second decoding operation implementing a second decoding algorithm, wherein the second decoding algorithm is different from the first decoding algorithm.

2. The decoder of claim 1, wherein the size is byte length of the encoded data packet.

3. The decoder of claim 1, wherein the first decoding operation is a sliding-window decoding operation.

4. The decoder of claim 1, wherein using the second decoding operation mitigates performance degradation associated with using the first decoding operation for encoded data packets within the second size range.

5. The decoder of claim 1, wherein the method implemented by the decoding logic further comprises setting size ranges.

6. The decoder of claim 4, wherein the second size range is smaller than the first size range and the second decoding operation is not a sliding-window decoding operation.

7. The decoder of claim 1, wherein the encoded data packets are compliant with the IEEE 802.16d/e protocol.

8. The decoder of claim 1, wherein said first and second decoding operations comprise Convolutional Turbo Code decoding operations.

9. A hard disk drive system including the decoder of claim 1.

10. A digital versatile disc drive system including the decoder of claim 1.

11. A high definition television system including the decoder of claim 1.

12. A vehicle communication system including the decoder of claim 1.

13. A cellular phone system including the decoder of claim 1.

14. A set-top box system including the decoder of claim 1.

15. A media player system including the decoder of claim 1.

16. A Voice over Internet Protocol (VoIP) phone system including the decoder of claim 1.

17. A method comprising:
receiving encoded data packets;
determining sizes of the encoded data packets; and
using a first decoding operation responsive to determining that the size of one of the encoded data packets is within a first size range, the first decoding operation implementing a first decoding algorithm; and
using a second decoding operation responsive to determining that the size of another of the encoded data packets is within a second size range, the second decoding operation implementing a second decoding algorithm, wherein the second decoding algorithm is different from the first decoding algorithm.

18. The method of claim 17, wherein the size is byte length of the encoded data packet.

19. The method of claim 17, wherein the first decoding operation is a sliding-window decoding operation.

20. The method of claim 17, wherein the second decoding operation is not a sliding-window decoding operation.

21. The method of claim 17 further comprising setting size ranges.

22. The method of claim 17, wherein the first and second size ranges are re-configurable.

23. The method of claim 17, wherein the encoded data packets are compliant with the IEEE 802.16d/e protocol.

24. The method of claim 17, wherein said first and second decoding operations comprise Convolutional Turbo Code decoding operations.

* * * * *

UNITED STATES PATENT AND TRADEMARK OFFICE
CERTIFICATE OF CORRECTION

| | | |
|---|---|---|
| PATENT NO. | : 7,965,710 B1 | Page 1 of 1 |
| APPLICATION NO. | : 11/945183 | |
| DATED | : June 21, 2011 | |
| INVENTOR(S) | : Joonsang Choi et al. | |

It is certified that error appears in the above-identified patent and that said Letters Patent is hereby corrected as shown below:

In column 10, line 53, after "packets;" delete "and".

In column 12, line 3, after "packets;" delete "and".

Signed and Sealed this

Sixteenth Day of August, 2011

David J. Kappos
*Director of the United States Patent and Trademark Office*